(12) United States Patent
Yamamoto

(10) Patent No.: US 8,419,219 B2
(45) Date of Patent: Apr. 16, 2013

(54) LIGHT EMITTING APPARATUS

(75) Inventor: Yuya Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/416,087

(22) Filed: Mar. 9, 2012

(65) Prior Publication Data

US 2012/0243220 A1    Sep. 27, 2012

(30) Foreign Application Priority Data

Mar. 23, 2011  (JP) .................................. 2011-064218

(51) Int. Cl.
*F21V 21/00*    (2006.01)

(52) U.S. Cl.
USPC ..................................... 362/249.02; 362/231

(58) Field of Classification Search .............. 362/231, 362/235–237, 249.01, 249.02, 268, 311.01, 362/311.02, 326, 329, 331, 555, 800, 806; 257/98–100, E25.02, E33.059, E33.073
See application file for complete search history.

(56) References Cited

U.S. PATENT DOCUMENTS

| | | | |
|---|---|---|---|
| 7,385,653 B2 * | 6/2008 | Kim et al. ........................ | 349/61 |
| 7,850,341 B2 * | 12/2010 | Mrakovich et al. ...... | 362/249.06 |
| 7,888,698 B2 * | 2/2011 | Wu et al. ......................... | 257/98 |
| 8,177,391 B2 * | 5/2012 | Ryu et al. ................. | 362/249.02 |

FOREIGN PATENT DOCUMENTS

| | | |
|---|---|---|
| JP | 2008-123969 | 5/2008 |
| JP | 2008-218485 | 9/2008 |
| JP | 2008-270701 | 11/2008 |
| JP | 2009-060094 | 3/2009 |

* cited by examiner

*Primary Examiner* — Hargobind S Sawhney
(74) *Attorney, Agent, or Firm* — Bacon & Thomas, PLLC

(57) ABSTRACT

A light emitting apparatus includes solid light-emitting elements being assorted into light emission groups each of which includes the solid light-emitting elements arranged adjacent to one another; transparent encapsulating members arranged in a corresponding relationship with the light emission groups to cover light emission surfaces of the solid light-emitting elements belonging to the corresponding light emission groups; and wavelength converting members arranged in a corresponding relationship with the transparent encapsulating members to cover light projection surfaces of the transparent encapsulating members, the wavelength converting members serving to wavelength-convert light beams emitted from the solid light-emitting elements to light beams having different colors, each of the wavelength converting members having a trough shape.

8 Claims, 9 Drawing Sheets

LIGHT EMITTING APPARATUS

FIELD OF THE INVENTION

The present invention relates to a light emitting apparatus including solid state light-emitting elements such as LEDs (Light Emitting Diodes) or the like.

BACKGROUND OF THE INVENTION

Conventionally, there is known a light emitting apparatus that emits light beams having different colors through the use of an LED and a wavelength converting member. For example, as shown in FIG. 12, the light emitting apparatus of this type includes an LED 100 for emitting a blue light beam, a wavelength converting member 20 for wavelength-converting the blue light beam emitted from the LED 100 to a yellow light beam, and a reflector 30 for reflecting a light beam. The yellow light beam generated by the wavelength converting member 20 is mixed with the blue light beam not wavelength-converted by the wavelength converting member 20, consequently becoming a white light beam. The white light beam is projected from the wavelength converting member 20 (see, e.g., Japanese Patent Application Publication Nos. 2008-270701, 2009-060094, 2008-218485 and 2008-123969).

In the light emitting apparatus referred to above, the optical path length of the light beams propagating through the wavelength converting member 20 varies depending on the irradiation angle of the light beams emitted from the LED 100. For example, as shown in FIG. 12, the light beam substantially vertically emitted from the LED 100 passes through the wavelength converting member 20 along an optical path length d1. In contrast, the light beam obliquely emitted from the LED 100 passes through the wavelength converting member 20 along an optical path length d2. Since d1 is smaller than d2, the light beam obliquely emitted from the LED 100 is more heavily wavelength-converted than the light beam substantially vertically emitted from the LED 100. Color unevenness is generated with ease because the light beams emitted from the LED 100 are differently wavelength-converted depending on the irradiation angles thereof. Due to the arrangement of the reflector 30 in the side area of the LED 100, it is impossible to irradiate the light beams to the lateral side of the light emitting apparatus.

SUMMARY OF THE INVENTION

In view of the above, the present invention provides a light emitting apparatus capable of generating light beams with reduced color unevenness and capable of distributing light beams to the lateral side thereof.

In accordance with an embodiment of the present invention, there is provided a light emitting apparatus, including: a plurality of solid light-emitting elements mounted on a wiring substrate, the solid light-emitting elements being assorted into a plurality of light emission groups each of which includes the solid light-emitting elements arranged adjacent to one another; a plurality of transparent encapsulating members arranged in a corresponding relationship with the light emission groups to cover light emission surfaces of the solid light-emitting elements belonging to the corresponding light emission groups; and a plurality of wavelength converting members arranged in a corresponding relationship with the transparent encapsulating members to cover light projection surfaces of the transparent encapsulating members, the wavelength converting members serving to wavelength-convert light beams emitted from the solid light-emitting elements to light beams having different colors corresponding to the light emission groups, each of the wavelength converting members having a trough shape to bulge toward a light projection surface thereof. The wavelength converting members may have a refractive index greater than a refractive index of the transparent encapsulating members.

Each of the wavelength converting members may be arranged to cover each of the light projection surfaces of the transparent encapsulating members directly or through a transparent member, an air layer or both of the transparent member and the air layer. The transparent member may have a refractive index smaller than the refractive index of the wavelength converting members but greater than the refractive index of the transparent encapsulating members.

The solid state light-emitting elements belonging to each of the light emission groups may be mounted on the wiring substrate in an alternating pattern or in a matrix pattern, the transparent encapsulating members and the wavelength converting members having an elongated shape or a quadrangular shape when seen from above.

The light emitting apparatus may further include a light diffusing panel for diffusing the light beams, the light diffusing panel being arranged to cover at least a portion of the light projection surfaces of the wavelength converting members.

The wavelength converting members may be configured to project light beams having red, green and blue colors.

Each of the transparent encapsulating members may have a trough shape to bulge toward the light projection surface thereof.

With such configuration, the wavelength converting members are formed into a trough shape. Therefore, as compared with a conventional light emitting apparatus, most of the light beams emitted from the solid light-emitting elements are incident on the wavelength converting members at a right angle. This reduces the difference in the optical path length of the light beams propagating through the wavelength converting members. Thus the respective light beams are wavelength-converted at a substantially equal level. As a result, it is possible to reduce color unevenness of the light beams projected from the wavelength converting members. Due to the formation of the wavelength converting members into a trough shape, the wavelength converting members are arranged even at the lateral sides of the solid light-emitting elements. This makes it possible to irradiate light beams toward the lateral sides of the light emitting apparatus. Moreover, the distribution of the light beams irradiated toward the lateral sides of the light emitting apparatus can be controlled by adjusting the curvature of the wavelength converting members.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

A light emitting apparatus according to a first embodiment of the present invention will now be described with reference to FIGS. 1 through 8B which form a part hereof. The light emitting apparatus of the present embodiment employs an LED as a solid light-emitting element.

Figure 1:
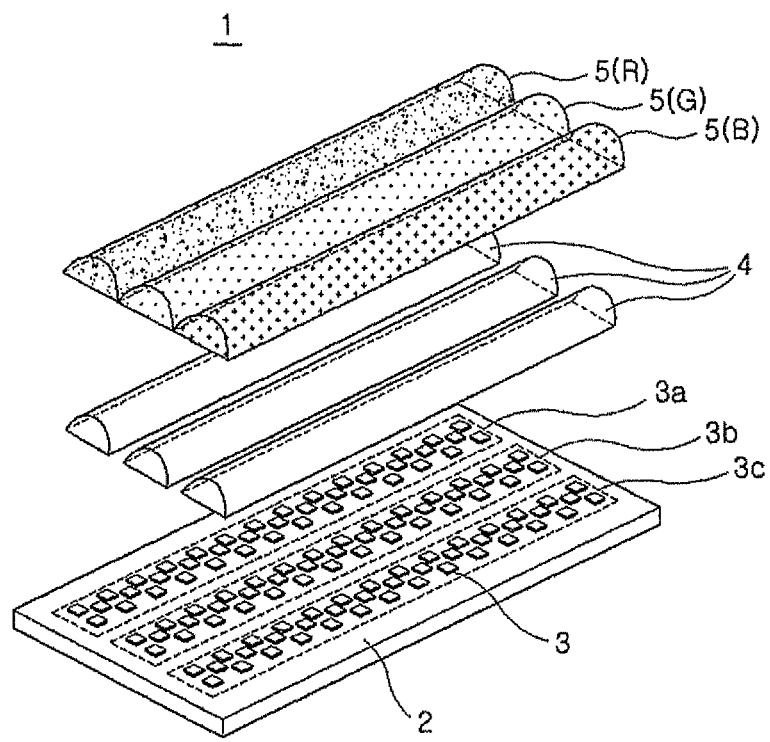
FIG. 1 is a perspective view showing a light emitting apparatus according to a first embodiment of the present invention.
Figure 2:
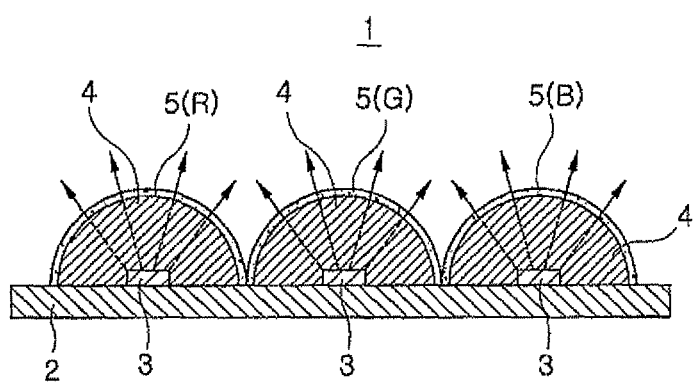
FIG. 2 is a vertical section view of the light emitting apparatus of the first embodiment.

As shown in FIGS. 1 and 2, the light emitting apparatus 1 includes a plurality of LEDs 3 mounted on a rectangular wiring substrate 2. All the LEDs 3 are point-like light sources. The LEDs 3 adjoining to one another make up independent groups, namely three light emission groups 3a, 3b and 3c. As the LEDs 3, it is desirable to use light emitting diodes capable of generating a near ultraviolet light beam having a peak wavelength of, e.g., 405 nm. The respective light emission groups 3a, 3b and 3c extend in the longitudinal direction of the wiring substrate and are arranged adjacent to one another. The LEDs 3 belonging to each of the light emission groups 3a, 3b and 3c are mounted on the wiring substrate 2 in an alternating pattern (or in a zigzag shape). The light projection surfaces of the LEDs 3 are covered with transparent encapsulating members 4 on a group-by-group basis. Each of the three transparent encapsulating members 4 is formed into a trough shape to have a bulging light projection surface. The light projection surfaces of the transparent encapsulating members 4 are covered with wavelength converting members 5 on a one-by-one basis. Just like the transparent encapsulating members 4, each of the wavelength converting members 5 is formed into a trough shape to have a bulging light projection surface. The three wavelength converting members 5 include a wavelength converting member 5(R: red), a wavelength converting member 5(G: green) and a wavelength converting member 5(B: blue). The wavelength converting member 5(R) includes a red fluorescent substance for wavelength-converting a near ultraviolet light beam emitted from the LEDs 3 to a red light beam. The wavelength converting member 5(G) includes a green fluorescent substance for wavelength-converting a near ultraviolet light beam emitted from the LEDs 3 to a green light beam. The wavelength converting member 5(B) includes a blue fluorescent substance for wavelength-converting a near ultraviolet light beam emitted from the LEDs 3 to a blue light beam. The wavelength converting members 5(R), 5(G) and 5(B) are arranged in a corresponding relationship with the light emission groups 3a, 3b and 3c.

The wiring substrate 2 is formed by using, as a base material thereof, a metal having a high thermal conductivity such as aluminum or a resin such as glass epoxy. A white solder resist having a thickness of 10 μm or more is applied on the surface of the wiring substrate 2. The wiring substrate 2 includes a light reflecting member (not shown) having a high reflectance, which is arranged on the LED mounting surface thereof. The light reflecting member is made of, e.g., silver or aluminum. The wiring substrate 2 further includes a wiring pattern (not shown) responsible for the supply of electric power to the LEDs 3. The structure and constituent material of the wiring substrate 2 is not limited to the one of the present embodiment. In addition, the wiring substrate 2 includes a holder (not shown) by which the wiring substrate 2 is attached to, e.g., a ceiling or a wall.

The number of the LEDs 3 mounted on the wiring substrate 2 is not particularly limited but is properly selected depending on a light flux required. The LEDs 3 may be either face-up mounted or flip-chip mounted to the wiring pattern of the wiring substrate 2.

The transparent encapsulating members 4 are made of a light-transmitting material having a refractive index of about 1.2 to about 1.7. Examples of the light-transmitting material include a transparent silicone resin, a transparent epoxy resin and a transparent glass. The shape of the transparent encapsulating members 4 is not necessarily limited to the trough shape but may be, e.g., a semi-elliptical shape.

The wavelength converting members 5 are formed by using, as a base material thereof, a light-transmitting material such as a transparent silicone resin or a transparent glass. The refractive index of the light-transmitting material is set greater than the refractive index of the material making up the transparent encapsulating members 4. The wavelength converting members 5 are arranged in direct contact with the light projection surfaces of the transparent encapsulating members 4. This structure can be obtained by potting the transparent encapsulating members 4 into the recess portions of the trough-shaped wavelength converting members 5, inverting the members 4 and 5 so as to encapsulate the LEDs 3 and then curing the transparent encapsulating members 4.

The light emitting apparatus 1 includes drivers (not shown) for controlling light emission of the LEDs 3. Each of the drivers includes a dimming unit composed of a switch and a microcomputer. The drivers are connected to a commercial power supply and are electrically connected to the LEDs 3 via the wiring pattern. The drivers control the on/off and dimming operations of the LEDs 3 by controlling the supply of electric power from the commercial power supply to the LEDs 3. The drivers are provided in plural numbers and are composed of three kinds of drivers, each of which collectively controls the LEDs 3 belonging to each of the light emission groups 3a, 3b and 3c.

Description will now be made on the operation of the light emitting apparatus 1 of the first embodiment configured as above. The light beams emitted from the LEDs 3 pass through the transparent encapsulating members 4 and then enter the wavelength converting members 5. Since the wavelength converting members 5 are formed into a trough shape, the light beams entering the wavelength converting members 5 are mostly incident on the wavelength converting members 5 at a right angle as indicated by dot line arrows in FIG. 2. This reduces the difference in the optical path length of the light beams propagating through the wavelength converting members 5. Thus the respective light beams are wavelength-converted at a substantially equal level. As a result, the light beams projected from the wavelength converting members 5 have reduced color unevenness. Moreover, the light beams entering the wavelength converting members 5 impinge against the fluorescent molecules contained in the wavelength converting members 5 and scatter in different directions. This reduces illuminance unevenness of the wavelength converting members 5. Thus the wavelength converting members 5 become planar light sources capable of generating even light beams over the entire surface thereof.

The wavelength converting members 5 wavelength-convert the near ultraviolet light beams emitted from the LEDs 3 to light beams of different colors (red, green and blue colors) with respect to each of the light emission groups 3a, 3b and 3c. As a result, the light beams projected from the wavelength converting members 5 have three primary colors. Since the wavelength converting members 5(R), 5(G) and 5(B) are arranged adjacent to one other, the light beams are easily mixed and become a white light beam having reduced color unevenness.

Figure 3:
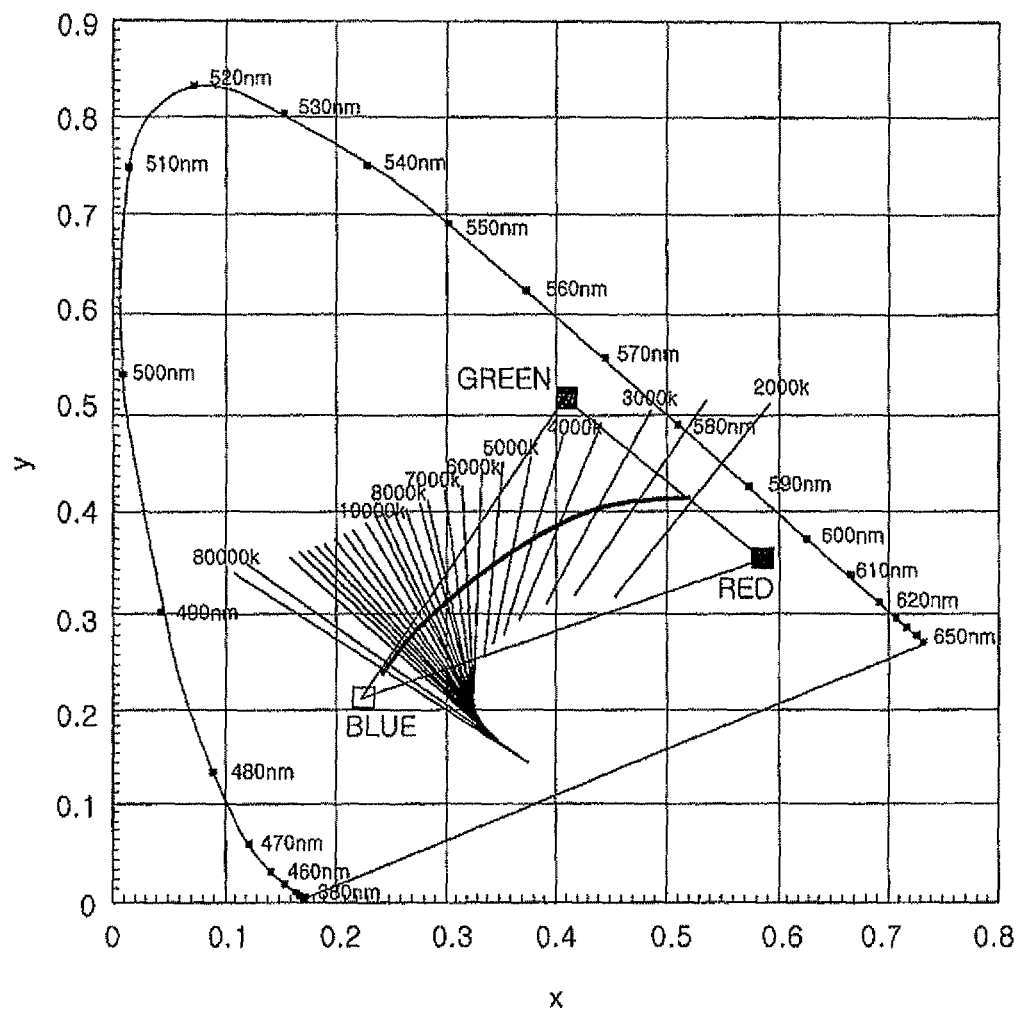
FIG. 3 is a diagram representing the x-y chromaticity of the light generated by the light emitting apparatus of the first embodiment.

The tone of the white light beam projected from the wavelength converting members 5 can be freely adjusted through the use of the drivers corresponding to the respective colors, insofar as the tone of the white light beam lies within a triangle interconnecting three red, green and blue color points in the chromaticity diagram shown in FIG. 3. For example, the driver for controlling the LEDs 3 belonging to the light emission group 3a is used to increase the outputs of the LEDs 3 and to increase the red light beam projected from the wavelength converting member 5(R). This makes it possible to convert the white light beam projected from the wavelength converting members 5 to a reddish white light beam. The tone and brightness of the white light beam projected from the wavelength converting members 5 can be adjusted by changing the kind and concentration of the fluorescent substances contained in the wavelength converting members 5 and the ratio of the concentration of the fluorescent substances contained in the wavelength converting members 5 to the concentration of other fluorescent substances.

Inasmuch as the wavelength converting members 5 are formed into a trough shape, the wavelength converting members 5 are arranged even at the lateral side of the LEDs 3. This makes it possible to irradiate the light beam even to the lateral side of the light emitting apparatus 1. The distribution of the light beams irradiated to the lateral side can be controlled by adjusting the curvature of the trough-shaped wavelength converting members 5.

The refractive index of the light-transmitting material making up the wavelength converting members 5 is set greater than the refractive index of the light-transmitting material making up the transparent encapsulating members 4. This makes it possible to prevent the light beams emitted from the LEDs 3 from being totally reflected in the interfaces between the members 4 and 5 (see FIG. 2). Accordingly, it is possible to enhance the light extraction efficiency of the light emitting apparatus 1. Some of the light beams scattering in the wavelength converting members 5 and the light beams totally reflected in the interfaces between the wavelength converting members 5 and the external environment (the ambient air) are totally reflected in the interfaces between the members 4 and 5. As a consequence, it becomes possible to reduce the amount of light beams coming back toward the inside of the light emitting apparatus 1.

Since the light reflecting member is provided on the LED mounting surface of the wiring substrate 2, the light beams not totally reflected in the interfaces between the members 4 and 5 and coming back toward the inside of the light emitting apparatus 1 are reflected by the light reflecting member and are moved toward the outside of the light emitting apparatus 1 again. This makes it possible to enhance the light extraction efficiency of the light emitting apparatus 1.

Due to the fact that the wiring substrate 2 is made of a material having an increased thermal conductivity, the heat generated during the light emission in the LEDs 3 and the heat generated during the wavelength conversion performed by the fluorescent substances of the wavelength converting members 5 can be dissipated to the external environment through the wiring substrate 2. As a result, it becomes possible to prevent abnormal temperature rise within the light emitting apparatus 1. It is therefore possible to prolong the lifespan of the LEDs 3 and to suppress thermal degradation of the fluorescent substances.

Since the LEDs 3 are arranged on the wiring substrate 2 in an alternating pattern (or in a zigzag shape), a gap is left between the LEDs 3 adjoining to each other. This makes it possible to efficiently dissipate the heat generated during light emission in the LEDs 3. Inasmuch as the LEDs 3 are arranged at an equal interval, illuminance unevenness is hardly generated in the light beams emitted from the LEDs 3.

The light emitting apparatus 1 may include an ultraviolet filter (not shown) for covering the light projection surface of the light emitting apparatus 1. The ultraviolet filter is a wavelength-controlling optical filter made of, e.g., a resin or a glass. The ultraviolet filter serves to cut off near ultraviolet light rays. The provision of the ultraviolet filter on the light projection surface of the light emitting apparatus 1 makes it possible to cut off the near ultraviolet light rays contained in the light beams irradiated by the light emitting apparatus 1. As a consequence, it becomes possible to safely use the light emitting apparatus 1 without adversely affecting the user of the light emitting apparatus 1.

Figure 4A:
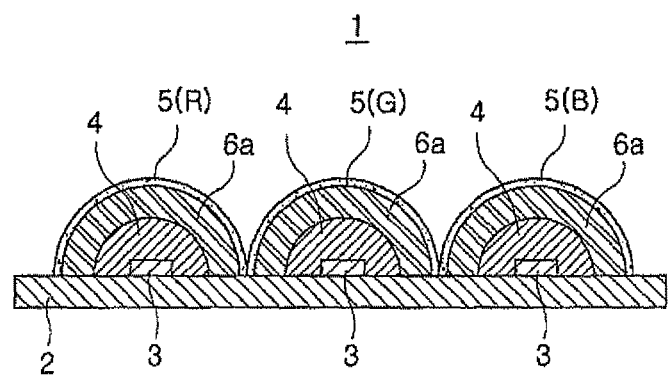
FIGS. 4A, 4B and 4C are vertical section views showing light emitting apparatuses according to a first modified example of the first embodiment.
Figure 4B:
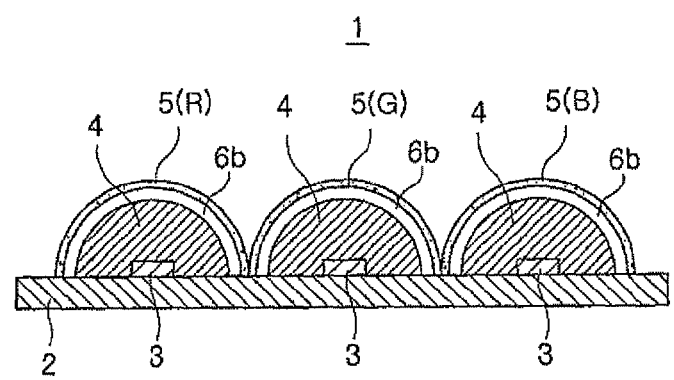
Figure 4C:
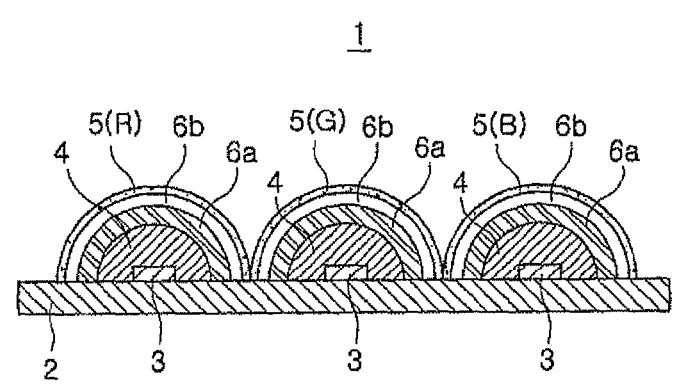

FIGS. 4A, 4B and 4C show light emitting apparatuses according to a first modified example of the first embodiment. The light emitting apparatus 1 shown in FIG. 4A includes trough-shaped transparent members 6a capable of transmitting the light beams projected from the transparent encapsulating members 4. The transparent members 6a are arranged between the transparent encapsulating members 4 and the wavelength converting members 5. This structure can be obtained by potting the transparent encapsulating members 4 into the recess portions of the transparent members 6a, inverting the members 4 and 6a so as to encapsulate the LEDs 3 and then covering the light projection surfaces of the transparent members 6a with the wavelength converting members 5. The transparent members 6a are made of a light-transmitting material having an increased thermal conductivity, e.g., a transparent glass. Due to the provision of the transparent members 6a, the heat generated during the wavelength conversion performed by the fluorescent substances of the wavelength converting members 5 can be efficiently dissipated to the wiring substrate 2 through the transparent members 6a and the transparent encapsulating members 4. This makes it possible to suppress thermal degradation of the fluorescent substances. The refractive index of the material making up the transparent members 6a is set greater than the refractive index of the material making up the transparent encapsulating members 4 but smaller than the refractive index of the material making up the wavelength converting members 5. This makes it possible to prevent the light beams emitted from the LEDs 3 from being totally reflected in the interfaces between the transparent encapsulating members 4 and the transparent members 6a or in the interfaces between the transparent members 6a and the wavelength converting members 5. It is therefore possible to enhance the light extraction efficiency of the light emitting apparatus 1. Moreover, it is possible to restrain the light beams wavelength-converted in the wavelength converting members 5 from coming back toward the inside of the light emitting apparatus 1.

The light emitting apparatus 1 shown in FIG. 4B includes air layers 6b arranged between the transparent encapsulating members 4 and the wavelength converting members 5. This structure can be obtained by encapsulating the LEDs 3 with the transparent encapsulating members 4 and then covering the light projection surfaces of the transparent encapsulating members 4 with the wavelength converting members 5 with a gap left therebetween. The provision of the air layers 6b makes it possible to prevent the light beams emitted from the LEDs 3 from being totally reflected in the interfaces between the wavelength converting members 5 and the air layers 6b. It is therefore possible to enhance the light extraction efficiency of the light emitting apparatus 1. Moreover, it is possible to restrain the light beams wavelength-converted in the wavelength converting members 5 from coming back toward the inside of the light emitting apparatus 1. Since the air layers 6b have a heat insulation function, the heat generated during wavelength conversion in the wavelength converting members 5 is hardly transferred to the transparent encapsulating members 4. This makes it possible to suppress thermal degradation of the transparent encapsulating members 4.

The light emitting apparatus 1 shown in FIG. 4C includes transparent members 6a and air layers 6b arranged between the transparent encapsulating members 4 and the wavelength converting members 5. The transparent members 6a and the air layers 6b are arranged in the named order from the LED mounting surface of the wiring substrate 2. This structure can be obtained by potting the transparent encapsulating members 4 into the recess portions of the transparent members 6a, inverting the members 4 and 6a so as to encapsulate the LEDs 3 and then covering the light projection surfaces of the transparent members 6a with the wavelength converting members 5 with a gap left therebetween. The provision of the transparent members 6a and the air layers 6b makes it possible to prevent the light beams emitted from the LEDs 3 from being totally reflected in the interfaces between the transparent encapsulating members 4 and the transparent members 6a or in the interfaces between the air layers 6b and the wavelength converting members 5. It is therefore possible to enhance the light extraction efficiency of the light emitting apparatus 1. Moreover, it is possible to restrain the light beams wavelength-converted in the wavelength converting members 5 from coming back toward the inside of the light emitting apparatus 1. Further, since the heat generated during wavelength conversion in the wavelength converting members 5 is hardly transferred to the transparent encapsulating members 4, it is possible to suppress thermal degradation of the transparent encapsulating members 4.

Figure 5:
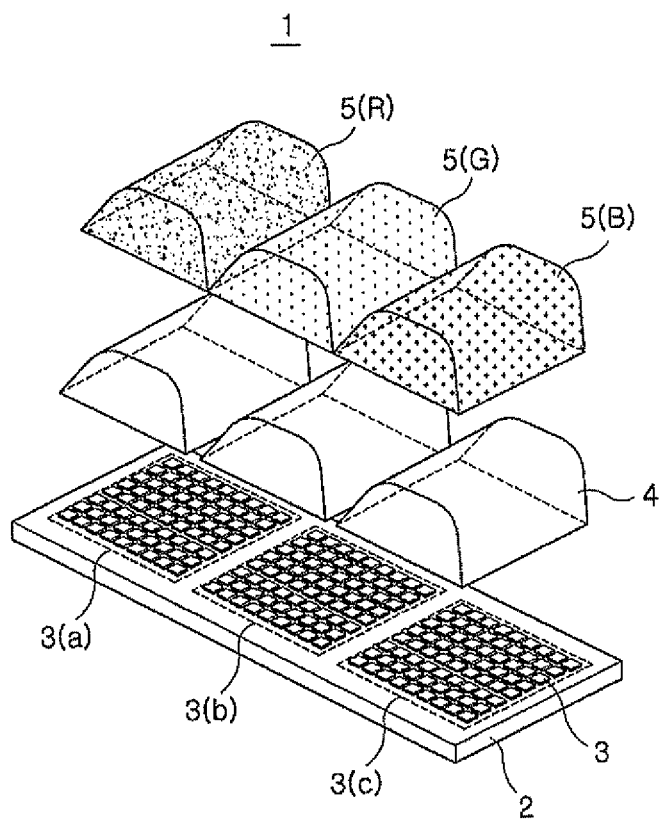
FIG. 5 is a perspective view showing a light emitting apparatus according to a second modified example of the first embodiment.

FIG. 5 shows a light emitting apparatus according to a second modified example of the first embodiment. The light emitting apparatus 1 shown in FIG. 5 includes LEDs 3 arranged in a matrix pattern in each of the light emission groups 3a, 3b and 3c, transparent encapsulating members 4 and wavelength converting members 5, latter two of which have a quadrangular plane shape when seen from above. The light emitting apparatus 1 of the second modified example has the same structure as that of the light emitting apparatus 1 shown in FIG. 1, except the arrangement of the LEDs 3, the structure of the transparent encapsulating members 4 and the structure of the wavelength converting members 5. With the second modified example, each of the light emission surfaces corresponding to the respective colors can be formed into a planar light source having a substantially square shape when the light emitting apparatus 1 is seen from above.

Figure 6:
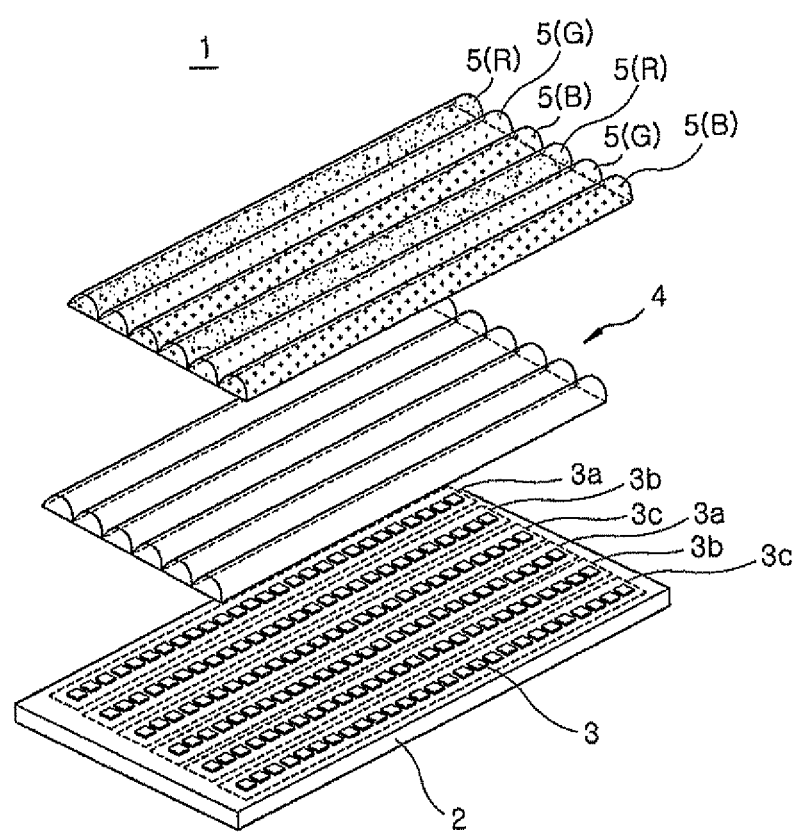
FIG. 6 is a perspective view showing a light emitting apparatus according to a third modified example of the first embodiment.

FIG. 6 shows a light emitting apparatus according to a third modified example of the first embodiment. The light emitting apparatus 1 shown in FIG. 6 includes two sets of light emission groups 3a, 3b and 3c, LEDs 3 linearly arranged in the respective light emission groups 3a, 3b and 3c, transparent encapsulating members 4 and wavelength converting members 5, latter two of which have an elongated shape when seen from above. In this regard, the light emission groups 3a, 3b and 3c include a first set of light emission groups 3a-3b-3c and a second set of light emission groups 3a-3b-3c arranged side by side. The light emitting apparatus 1 of the third modified example has the same structure as that of the light emitting apparatus 1 shown in FIG. 1, except the arrangement of the LEDs 3, the structure of the transparent encapsulating members 4 and the structure of the wavelength converting members 5. With the third modified example, the light projection area of each of the wavelength converting members 5 is smaller than that of the light emitting apparatus 1 shown in FIG. 1. Thus the light beams of different colors projected from the adjoining wavelength converting members 5 are mixed with ease. This makes it possible to further reduce the color unevenness of the white light beam projected from the light emitting apparatus 1.

Figure 7A:
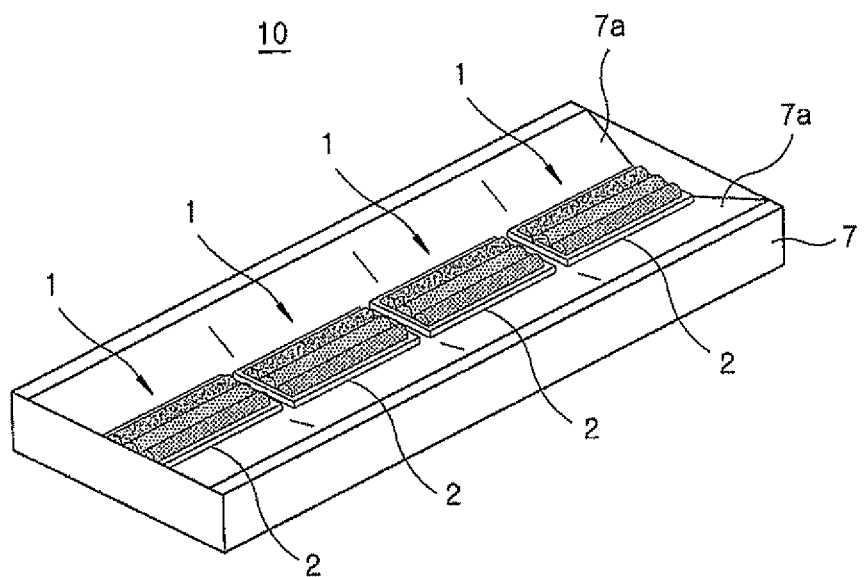
FIG. 7A is a perspective view showing a lighting apparatus employing the light emitting apparatus of the first embodiment.
Figure 7B:
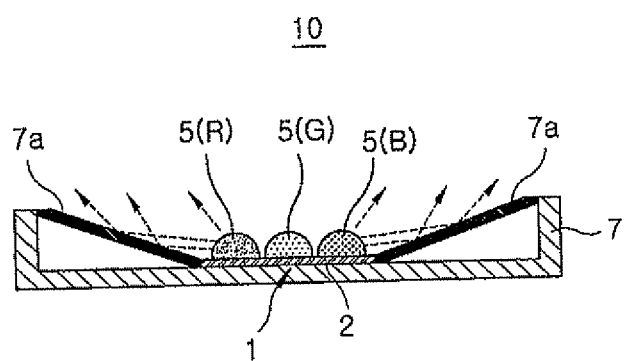
FIG. 7B is a vertical section view of the lighting apparatus.

FIGS. 7A and 7B show a lighting apparatus employing a plurality of the light emitting apparatuses 1 described above. The lighting apparatus 10 includes four light emitting apparatuses 1 arranged in an end-to-end relationship. The light emitting apparatuses 1 are held in a housing 7 through the use of holders (not shown) provided in the wiring substrates 2 of the light emitting apparatuses 1. The housing 7 is made of a light and highly rigid material, e.g., a polyethylene terephthalate (PET) resin. The housing 7 is a rectangular case with one open surface. The light emitting apparatuses 1 are accommodated within the central region of the recess portion of the housing 7 with the light emission surfaces of the light emitting apparatuses 1 facing the open surface of the housing 7. Flat reflector plates 7a are obliquely installed so as to interconnect the edges of the light emitting apparatuses 1 and the edge of the opening of the housing 7. The reflector plates 7a are formed of a material having a high reflectance, e.g., an aluminum plate. As indicated by dot line arrows in FIG. 7B, the reflector plates 7a reflect the light beams irradiated toward the lateral sides of the light emitting apparatuses 1 and direct the reflected light beams toward the outside of the lighting apparatus 10, thereby enhancing the light extraction efficiency of the lighting apparatus 10. With the lighting apparatus 10, it is possible to obtain a linear lighting apparatus capable of irradiating a white light beam with reduced illuminance unevenness and color unevenness. The number and arrangement of the light emitting apparatuses 1 mounted to the lighting apparatus 10 is not limited to the one of the present embodiment. Likewise, the materials making up the housing 7 and the reflector plates 7a and the structures thereof are not limited to the ones described above.

Figure 8A:
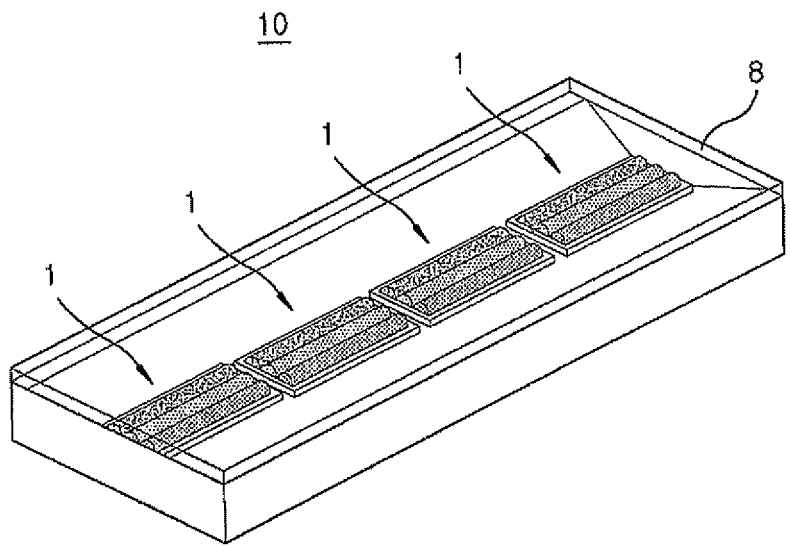
FIG. 8A is a perspective view showing a modified example of the lighting apparatus.
Figure 8B:
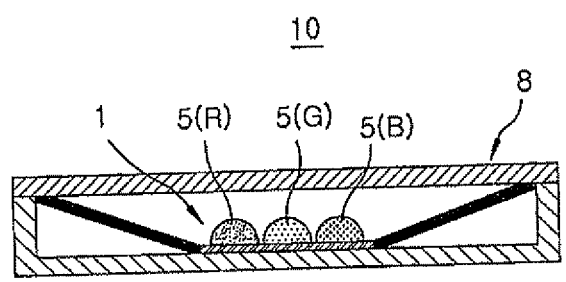
FIG. 8B is a vertical section view of the lighting apparatus.

As shown in FIGS. 8A and 8B, the lighting apparatus 10 may include a light diffusing panel 8 arranged on the light projection surface thereof. The light diffusing panel 8 is made of, e.g., a polycarbonate resin or an acryl resin having light diffusing particles such as calcium carbonate particles or acryl particles dispersed therein. Alternatively, the light diffusing panel 8 may be made of a polycarbonate resin or an acryl resin having fine corrugations formed on at least one of the front and rear surfaces thereof by frost processing or other methods. The provision of the light diffusing panel 8 makes it possible to diffuse the red, green and blue light beams projected from the wavelength converting members 5(R), 5(G) and 5(B) in many different directions. As compared with the lighting apparatus 10 shown in FIGS. 7A and 7B, it is therefore possible to further reduce the color unevenness and illuminance unevenness of the white light beam irradiated from the lighting apparatus 10. If the light diffusing panel 8 is made of a relatively hard material, it is possible for the light diffusing panel 8 to serve as an outer shell member for protecting the lighting apparatus 10 from shocks or the like. While the light diffusing panel 8 is arranged to cover the entire light projection surface of the lighting apparatus 10 in the present embodiment, the light diffusing panel 8 may be arranged to cover a portion of the light projection surface of the lighting apparatus 10.

With the first embodiment, the modified examples thereof and the lighting apparatus employing the first embodiment and the modified examples thereof, it is possible to obtain a light emitting apparatus 1 and a lighting apparatus 10 capable of generating a white light beam which has reduced color unevenness and illuminance unevenness while enabling a dimming control. The light emitting apparatus 1 and the lighting apparatus 10 are capable of irradiating light beams which can be distributed to the lateral sides.

Figure 9:
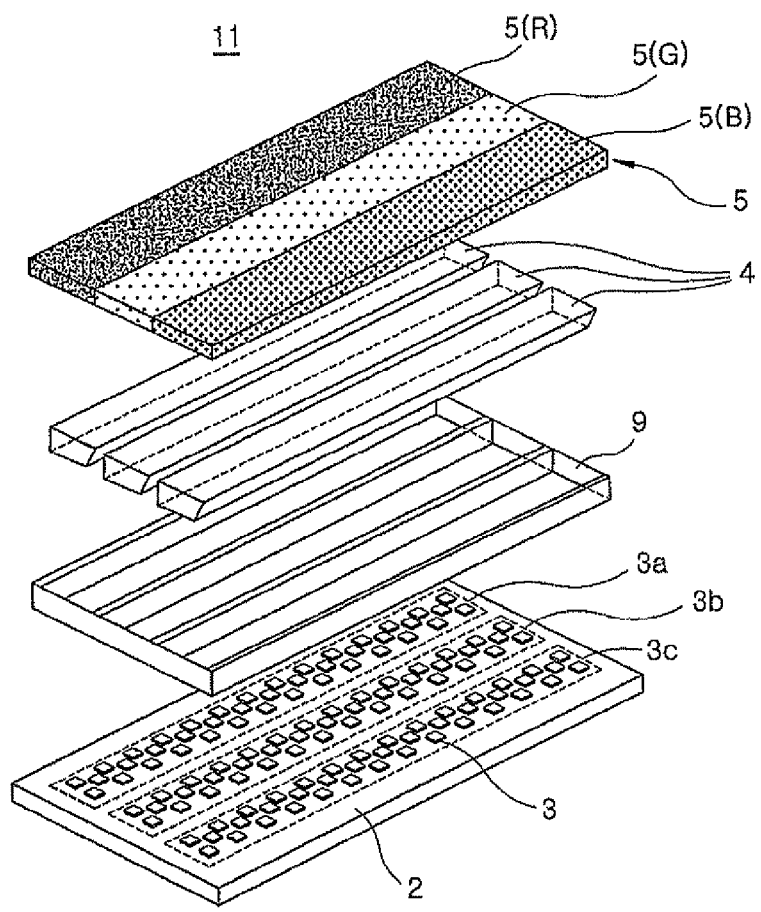
FIG. 9 is a perspective view showing a light emitting apparatus according to a second embodiment of the present invention.
Figure 10:
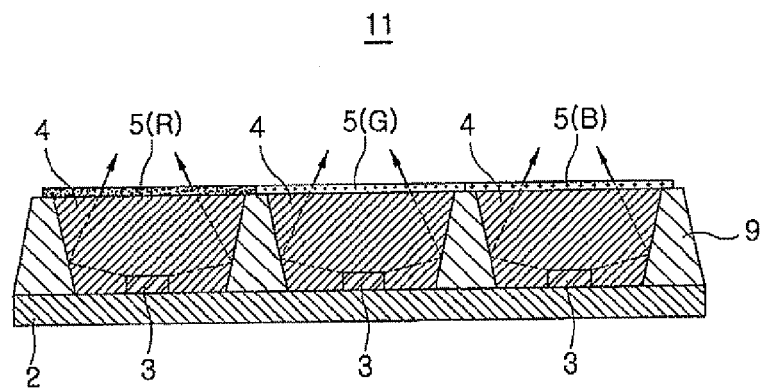
FIG. 10 is a vertical section view of the light emitting apparatus of the second embodiment.

Next, a light emitting apparatus according to a second embodiment of the present invention will be described with reference to FIGS. 9 through 11. Referring to FIGS. 9 and 10, the light emitting apparatus 11 includes a wiring substrate 2 and a plurality of LEDs 3 mounted on the wiring substrate 2 and assorted into three light emission groups 3a, 3b and 3c. The LEDs 3 of the respective light emission groups 3a, 3b and 3c are isolated from one another by a frame member 9 arranged on the wiring substrate 2. The frame member 9 is made of a material having a high reflectance, such as aluminum or the like. The frame member 9 includes a rectangular brim having a size substantially equal to the size of the wiring substrate 2 and opened at the light incident side and the light projection side thereof and a plurality of band-like plates dividing the inside of the brim into a plurality of spatial regions. In this regard, each of the spatial regions of the frame member 9 is formed into an inverted trapezoidal shape to grow wider toward the light projection side. Transparent encapsulating members 4 are filled into the respective spatial regions of the frame member 9. Each of the respective transparent encapsulating members 4 encapsulates the LEDs 3 belonging to each of the light emission groups 3a, 3b and 3c. Flat wavelength converting members 5 are arranged to cover the light projection surfaces of the three transparent encapsulating members 4. The wavelength converting members 5 include a wavelength converting member 5(R) arranged in a position corresponding to the light emission group 3a, a wavelength converting member 5(G) arranged in a position corresponding to the light emission group 3b and a wavelength converting member 5(B) arranged in a position corresponding to the light emission group 3c. The light emitting apparatus 11 of the second embodiment has the same structure as that of the light emitting apparatus 1 shown in FIG. 1, except the provision of the frame member 9 and the difference in the structures of the transparent encapsulating members 4 and the wavelength converting members 5.

Description will now be made on the operation of the light emitting apparatus 11 of the second embodiment. The light beams emitted from the LEDs 3 pass through the transparent encapsulating members 4 and then enter the wavelength converting members 5. The light beams entering the wavelength converting members 5 are converted to red, green and blue light beams in the wavelength converting members 5(R), 5(G) and 5(B) and are projected from the wavelength converting members 5. Since the wavelength converting members 5(R), 5(G) and 5(B) are arranged adjacent to one another, the red, green and blue light beams are mixed with ease and becomes a white light beam having reduced color unevenness. Moreover, the light beams entering the wavelength converting members 5 impinge against the fluorescent molecules contained in the wavelength converting members 5 and scatter in different directions. This reduces illuminance unevenness of the wavelength converting members 5. Thus the wavelength converting members 5 become planar light sources capable of generating even light beams over the entire surface thereof.

The wavelength converting members 5 are formed into a simple flat shape and therefore can be more readily manufactured than the trough-shaped wavelength converting members 5 employed in the light emitting apparatus 1 of the first embodiment. Accordingly, it is possible to reduce the time and effort required in manufacturing the light emitting apparatus 11.

Since the frame member 9 is made of a material having a high reflectance and the spatial regions thereof are formed into an inverted trapezoidal shape, the light beams emitted from the LEDs 3 toward the lateral sides can be reflected by the frame member 9 and can be incident on the wavelength converting members 5 as indicated by dot line arrows in FIG. 10. This makes it possible to enhance the light extraction efficiency of the light emitting apparatus 11.

Figure 11:
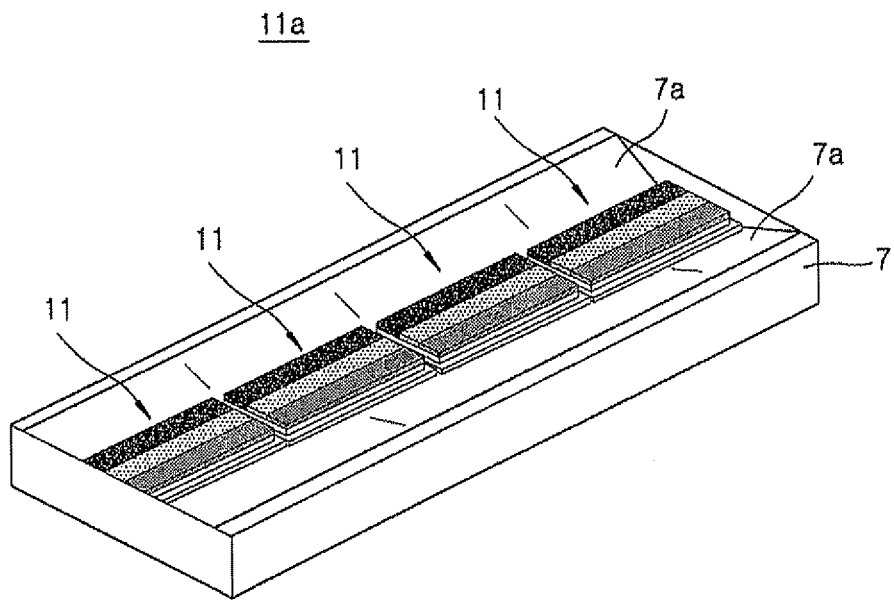
FIG. 11 is a perspective view showing a lighting apparatus employing the light emitting apparatus of the second embodiment.
Figure 12:
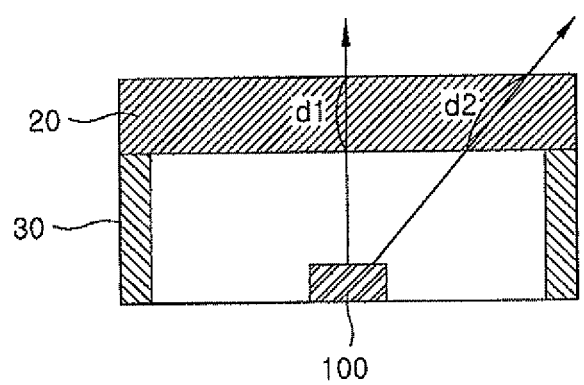
FIG. 12 is a vertical section view illustrating a conventional light emitting apparatus.

FIG. 11 shows a lighting apparatus 11a employing a plurality of the light emitting apparatuses 11 described above. The lighting apparatus 11a includes four light emitting apparatuses 11 arranged in an end-to-end relationship, a housing 7 for holding the light emitting apparatuses 11 and reflector plates 7a for reflecting the light beams projected from the light emitting apparatuses 11. The housing 7 and the reflector plates 7a are the same as those employed in the lighting apparatus 10. Since the time and effort required in manufacturing the light emitting apparatus 11 is reduced as set forth above, the lighting apparatus 11a can be more easily manufactured than the lighting apparatus 10.

With the light emitting apparatus of the second embodiment and the lighting apparatus employing the same, it is possible to, as compared with the light emitting apparatus 1 and the lighting apparatus 10, more easily manufacture a light emitting apparatus 11 and a lighting apparatus 11a capable of generating a white light beam which has reduced color unevenness and illuminance unevenness while enabling a dimming control.

The light emitting apparatus of the present invention is not limited to the embodiments described above but may be modified in many different forms. For example, the solid light-emitting element is not limited to the near ultraviolet LED employed in the foregoing embodiments but may be, e.g., an LED for generating a light beam having another color or an organic EL (Electroluminescence) element. The solid light-emitting element is not necessarily formed of a single kind of solid light-emitting element. The kinds of solid light-emitting elements employed in the respective light emission groups may differ from one another. Different kinds of solid light-emitting elements may be employed in one and the same light emission group. While the light emitting apparatus is configured to irradiate a white light beam in the foregoing embodiments, the light emitting apparatus may be formed to irradiate a light beam having another color. The fluorescent substances contained in the wavelength converting members are not limited to the ones of the foregoing embodiments but may be other kinds of fluorescent substances. The materials responsible for the wavelength conversion are not limited to the fluorescent substances but may be, e.g., phosphors. Each of the wavelength converting members may include an optical filter for transmitting only a light beam having a specific wavelength among the light beams emitted from the solid light-emitting elements. The arrangement of the wavelength converting members is not limited to the one of the foregoing embodiment. The embodiments and the modified examples described above may be used in combination.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A light emitting apparatus, comprising:
a plurality of solid light-emitting elements mounted on a wiring substrate, the solid light-emitting elements being assorted into a plurality of light emission groups each of which includes the solid light-emitting elements arranged adjacent to one another;
a plurality of transparent encapsulating members arranged in a corresponding relationship with the light emission groups to cover light emission surfaces of the solid light-emitting elements belonging to the corresponding light emission groups; and
a plurality of wavelength converting members arranged in a corresponding relationship with the transparent encapsulating members to cover light projection surfaces of the transparent encapsulating members, the wavelength converting members serving to wavelength-convert light beams emitted from the solid light-emitting elements to light beams having different colors corresponding to the light emission groups, each of the wavelength converting members having a trough shape to bulge toward a light projection surface thereof.

2. The apparatus of claim 1, wherein the wavelength converting members have a refractive index greater than a refractive index of the transparent encapsulating members.

3. The apparatus of claim 1, wherein each of the wavelength converting members is arranged to cover each of the light projection surfaces of the transparent encapsulating members directly or through a transparent member, an air layer or both of the transparent member and the air layer.

4. The apparatus of claim 3, wherein the transparent member has a refractive index smaller than the refractive index of the wavelength converting members but greater than the refractive index of the transparent encapsulating members.

5. The apparatus of claim 1, wherein the solid state light-emitting elements belonging to each of the light emission groups are mounted on the wiring substrate in an alternating pattern or in a matrix pattern, the transparent encapsulating members and the wavelength converting members having an elongated shape or a quadrangular shape when seen from above.

6. The apparatus of claim 1, further comprising:
a light diffusing panel for diffusing the light beams, the light diffusing panel being arranged to cover at least a portion of the light projection surfaces of the wavelength converting members.

7. The apparatus of claim 1, wherein the wavelength converting members are configured to project light beams having red, green and blue colors.

8. The apparatus of claim 1, wherein each of the transparent encapsulating members has a trough shape to bulge toward the light projection surface thereof.

* * * * *